United States Patent [19]

Tokunaga et al.

[11] Patent Number: 5,281,283
[45] Date of Patent: Jan. 25, 1994

[54] GROUP III-V COMPOUND CRYSTAL ARTICLE USING SELECTIVE EPITAXIAL GROWTH

[75] Inventors: Hiroyuki Tokunaga, Kawasaki; Takao Yonehara, Atsugi, both of Japan

[73] Assignee: Canon Kabushiki Kaisha, Tokyo, Japan

[21] Appl. No.: 985,751

[22] Filed: Dec. 4, 1992

Related U.S. Application Data

[63] Continuation of Ser. No. 769,167, Sep. 30, 1991, abandoned, which is a continuation of Ser. No. 663,797, Mar. 4, 1991, abandoned, which is a continuation of Ser. No. 552,847, Jul. 16, 1990, abandoned, which is a continuation of Ser. No. 173,543, Mar. 25, 1988, abandoned.

[30] Foreign Application Priority Data

Mar. 26, 1987 [JP] Japan ................................. 63-71988

[51] Int. Cl.$^5$ ............................................. H01L 21/20
[52] U.S. Cl. ............................ 148/33.2; 148/DIG. 26; 148/33.3; 437/83; 437/89; 437/110
[58] Field of Search ................. 148/33, 33.1, 33.2, 148/33.3, DIG. 26; 437/83, 89, 110

[56] References Cited

U.S. PATENT DOCUMENTS

| | | | |
|---|---|---|---|
| 3,620,833 | 11/1971 | Gleim | 437/62 |
| 3,764,409 | 10/1973 | Nomura et al. | 437/90 |
| 3,885,061 | 5/1975 | Corboy et al. | 437/81 |
| 4,131,496 | 12/1978 | Weitzel et al. | 156/613 |
| 4,174,422 | 11/1979 | Matthews et al. | 428/621 |
| 4,279,688 | 7/1981 | Abrahams et al. | 156/613 |
| 4,467,521 | 8/1984 | Spooner et al. | 156/612 |
| 4,470,192 | 9/1984 | Miller | 156/612 |
| 4,479,847 | 10/1984 | McCaldin et al. | 156/624 |
| 4,549,926 | 10/1985 | Corboy et al. | 156/612 |
| 4,551,394 | 11/1985 | Betsch et al. | 357/17 |
| 4,587,717 | 5/1986 | Daniele et al. | 437/129 |
| 4,657,603 | 4/1987 | Kruehler et al. | 437/133 |
| 4,816,420 | 3/1989 | Bozler et al. | 437/5 |

FOREIGN PATENT DOCUMENTS

| | | |
|---|---|---|
| 0130650 | 1/1985 | European Pat. Off. . |
| 0241204 | 10/1987 | European Pat. Off. . |
| 244081 | 11/1987 | European Pat. Off. . |
| 59-28377 | 2/1984 | Japan . |

OTHER PUBLICATIONS

Chen et al, "Embedded Epitaxial Growth ..." Applied Physics Letters, 38(5), Mar. 1, 1981, pp. 301-303.
J. Cr. Growth, 77 (1986), pp. 297-302, Kamon et al.
Br. J. Appl. Phys. (1967) vol. 18, p. 1380, Filby et al.
Appl. Phys. Ltrs., 48, (1986) Jan., No. 2, Hong et al.
J. Appl. Phys. 58 (1985) Oct., No. 7, Oku et al.

*Primary Examiner*—Robert Kunemund
*Attorney, Agent, or Firm*—Fitzpatrick, Cella, Harper & Scinto

[57] ABSTRACT

A III-V group compound crystal article comprises a substrate having a non-nucleation surface with smaller nucleation density ($S_{NDS}$) and a nucleation surface ($S_{NDL}$) which is arranged adjacent to said non-nucleation surface ($S_{NDS}$), has a sufficiently small area for a crystal to grow only from a single nucleus and a larger nucleation density ($ND_L$) than the nucleation density ($ND_S$) of said non-nucleation surface ($S_{NDS}$) and is comprised of an amorphous material, and a III-V group compound monocrystal grown from said single nucleus on said substrate and spread on said non-nucleation surface ($S_{NDS}$) beyond said nucleation surface ($S_{NDL}$).

13 Claims, 14 Drawing Sheets

GROUP III-V COMPOUND CRYSTAL ARTICLE USING SELECTIVE EPITAXIAL GROWTH

This application is a continuation of application Ser. No. 07/769,167, filed Sep. 30, 1991, now abandoned which, in turn, is a continuation of application Ser. No. 07/663,797, filed Mar. 4, 1991, now abandoned which, in turn, is a continuation of application Ser. No. 07/552,847, filed Jul. 16, 1990, now abandoned which, in turn, is a continuation of application Ser. No. 07/173,543, filed Mar. 25, 1988, now abandoned.

BACKGROUND OF THE INVENTION

1. Field of the invention

This invention relates to a III-V group compound crystal article and a process for producing the same, particularly to a III-V group compound monocrystalline article or a III-V group compound polycrystalline article controlled in grain size prepared by utilizing the nucleation density difference of the deposition materials depending on the kind of the materials for the crystal forming surface and a process for producing the same.

The present invention may be applied for formation of crystal such as monocrystal, polycrystal, etc. to be used for, for example, semiconductor integrated circuit, optical integrated circuit, optical device, etc.

2. Related Background Art

In the prior art, monocrystalline thin films to be used for semiconductor electronic device, optical device, etc. has been formed by epitaxial growth on a monocrystal substrate. For example, on a Si monocrystal substrate (silicon wafer), Si, Ge, GaAs, etc. have been known to be epitaxially grown from liquid phase, gas phase or solid phase, and also on a GaAs monocrystal substrate, monocrystals of GaAs, GaAlAs, etc. have been known to be epitaxially grown. By use of the semiconductor thin film thus formed, semiconductor devices and integrated circuits, emission devices such as semiconductor laser or LED are prepared.

Also, in recent years, researches and developments have been abundantly done about ultra-high speed transistor by use of two-dimensional electron gas, ultra-lattice device utilizing quantum well, etc., and these have been made possible by high precision epitaxial technique such as MBE (molecular beam epitaxy) by use of ultra-high vacuum, MOCVD (organometallic chemical vapor deposition), etc.

In such epitaxial growth on a monocrystal substrate, it is necessary to take matching in lattice constant and coefficient of thermal expansion between the monocrystal material of the substrate and the epitaxial growth layer. If such matching is insufficient, lattice defects will be generated in the epitaxial layer. Also, the elements constituting the substrate may be sometimes diffused into the epitaxial layer.

Thus, it can be understood that the process for forming a monocrystal thin film of the prior art according to epitaxial growth depends greatly on its substrate material. Mathews et al examined the combinations of the substrate materials with the epitaxial growth layers (EPITAXIAL GROWTH, Acdemic Press, New York, 1975 ed. by J. W. Mathews).

Also, the size of the substrate is presently about 6 inches for Si wafer, and enlargement of GaAs, sapphire substrate is further delayed. In addition, since the production cost of a monocrystal substrate is high, the cost per chip becomes high.

Thus, for forming a monocrystal layer capable of preparing a device of good quality according to the process of the prior art, there has been the problem that the kinds of the substrate material are limited to an extremely narrow scope.

On the other hand, in recent years, research and development have been actively done about three-dimensional integrated circuits for accomplishing high integration and multi-functionality by forming semiconductor elements by lamination in the direction normal to the surface of the substrate, and also research and development about a large area semiconductor device such as a solar battery in which elements are arranged in an array on an inexpensive glass or switching transistors of liquid crystal picture elements, etc. are becoming more active year by year.

What is common in both of these techniques is that the technique to form a semiconductor thin film on an amorphous insulating material substrate and form an electronic element such as transistor, etc. in the semiconductor thin film is required. Among them, it has been particularly desired to have a technique to form a monocrystalline semiconductor layer of high quality on an amorphous insulating material substrate.

Generally speaking, when a thin film is formed on an amorphous insulating substrate such as $SiO_2$, etc., due to deficiency of long length order of the substrate material, the crystal structure of the deposited film becomes amorphous or polycrystalline. Here, "amorphous film" refers to one with the state in which short length order to the minimum extent on the order of atom may be maintained, but there is no longer length order, while "polycrystalline film" refers to one in which monocrystal grains having no specific crystal orientation are gathered as separated with grain boundaries.

For example, when Si is formed on $SiO_2$ by the CVD method, if the deposition temperature is about 600° C. or lower, amorphous silicon is formed, while at a temperature higher than that, polycrystalline silicon with grain sizes distributed between some hundreds to some thousands Å is formed. However, the grain size and its distribution will vary greatly depending on the formation method.

Further, a polycrystalline thin film with a large grains size of about micron or millimeter is obtained by melting and solidifying an amorphous or polycrystalline film with an energy beam such as laser, rod-shaped heater, etc. (Single-Crystal silicon on non-single-crystal insulators, Journal of Crystal Growth vol. 63, No. 3, October 1983, edited by G. W. Cullen).

When transistors are formed in thin films of various crystal structures thus formed, and electron mobility is measured from its characteristics, a mobility of ca. 0.1 $cm^2/V.sec$ is obtained for amorphous silicon, a mobility of 1 to 10 $cm^2/V.sec$ for polycrystalline silicon having a grain size of some hundred Å, and a mobility to the same extent as in the case of monocrystal silicon for polycrystalline silicon with a large grain size obtained by melting and solidification.

From these results, it can be understood that there is great difference in electrical characteristics between the element formed in a monocrystal region within the crystal grain and the element formed as crossing over the grain boundary. In other words, the semiconductor deposited film on an amorphous substrate obtained according to the prior art method has an amorphous structure or a polycrystalline structure having grain size distribution, and the semiconductor electronic element prepared in such deposited films is greatly inferior in performance as compared with a semiconductor electronic element prepared in a monocrystal layer. For this reason, uses are limited to simple switching element, solar battery, photoelectric transducing element, etc.

Also, the method for forming a polycrystalline thin film with a large grain size by melting and solidification had the problem that enormous time is required for making grain size larger, because each wafer is scanned with an energy beam to convert an amorphous or polycrystalline thin film to a polycrystalline thin film with a large grain size, whereby bulk productivity is poor and the method is not suited for enlargement of area.

On the other hand, III-V group compound semiconductors are expected to be a material capable of realizing a new device not realized by Si, such as ultra-high speed device, optical element, etc., but III-V group compound crystal can be grown only on Si monocrystal substrate or a III-V group compound monocrystal substrate, which has been a great obstacle in preparation of a device.

As described above, in the crystal growth method of III-V group compound crystal of the prior art and the crystal formed thereby, three-dimensional integration or area enlargement cannot be easily done, and practical application for a device has been difficult, whereby a crystal such as monocrystal, polycrystal, etc. required for preparing a device having excellent characteristics cannot be formed easily and at low cost.

SUMMARY OF THE INVENTION

An object of the present invention is to solve such drawbacks of the prior art and to provide a III-V group compound crystal article of good quality grown on a large area, a III-V group compound article well controlled in crystal grain size and located position of crystal grain and a III-V group compound article formed on an amorphous insulating substrate such as $SiO_2$.

Another object of the present invention is to provide a process for forming the III-V group compound crystal article as described above according to simple steps with good efficiency without using a special device.

According to the present invention, there is provided a III-V group compound crystal article, which comprises a substrate having a non-nucleation surface with smaller nucleation density ($S_{NDS}$) and a nucleation surface ($S_{NDL}$) which is arranged adjacent to said non-nucleation surface ($S_{NDS}$), has a sufficiently small area for a crystal to grow only from a single nucleus and a larger nucleation density ($ND_L$) than the nucleation density ($ND_S$) of said non-nucleation surface ($S_{NDS}$) and is comprised of an amorphous material, and a III-V group compound monocrystal grown from said single nucleus on said substrate and spread on said non-nucleation surface ($S_{NDS}$) beyond said nucleation surface ($S_{NDL}$).

Also, the present invention comprises applying, in a gas phase including a starting material for supplying Group III atoms and a starting material for supplying Group V atoms, crystal forming treatment on a substrate having a free surface comprising a non-nucleation surface ($S_{NDS}$) with smaller nucleation density and a nucleation surface ($S_{NDL}$) arranged adjacent thereto having a sufficiently small area for a crystal to grow only from a singlenucleus and a larger nucleation density ($ND_L$) than the nucleation density ($ND_S$) of said non-nucleation surface ($S_{NDS}$) and comprised of an amorphous material, thereby growing a III-V group compound monocrystal from said single nucleus.

Further, the present invention comprises forming with an amorphous material, in a gas phase including a starting material for supplying Group III atoms and a starting material for supplying Group V atoms, on a substrate having a non-nucleation surface ($S_{NDS}$) with smaller nucleation density at a desired position of said non-nucleation surface ($S_{NDS}$), a nucleation surface ($S_{NDL}$) having a larger nucleation density ($ND_L$) than the nucleation density ($ND_S$) of said non-nucleation surface ($S_{NDS}$) and a sufficiently small area for a crystal to grow only from a single nucleus and then applying crystal forming treatment on said substrate to form a single nucleus on said nucleation surface ($S_{NDL}$) to grow a III-V group compound monocrystal from said single nucleus.

The III-V group compound crystal article according to the present invention is not restricted with respect to the material of the base substrate as in the prior art, and therefore can accomplish easily three-dimensional integration, area enlargement and low cost. For example, since a monocrystal or polycrystal of a III-V group compound can be formed easily on an amorphous insulating substrate, a multi-layer formation of an element with excellent electrical characteristics can be accomplished to realize a multi-functional integrated circuit not found in the prior art.

Also, the process for forming the III-V group compound crystal of the present invention, by forming a nucleation surface ($S_{NDL}$) of a material with sufficiently larger nucleation density (ND) than the material for formation of the non-nucleation surface ($S_{NDS}$) sufficiently finely so that only a single nucleus may grow, permits a monocrystal to grow selectively corresponding one by one to the site where the fine nucleation surface ($S_{NDL}$) exists, whereby a monocrystal with necessary size, monocrystals in shape of a plurality of islands, a polycrystal with controlled grain size and grain size distribution, etc. can be formed easily on the base substrate of any desired material. Besides, it can be formed by use of a device used in conventional semiconductor process, without requiring any special new preparation device.

DESCRIPTION OF THE PREFERRED EMBODIMENTS

First, for better understanding of the present invention, general thin film forming process of metal or semiconductor is to be explained.

When the deposition surface (crystal growth surface) is of a material different from the flying atoms, particularly an amorphous material, the flying atoms will be freely diffused on the substrate and reevaporated (eliminated). And, as the result of collision mutually between the atoms, a nucleus is formed, and when the nucleus reaches the size rc ($=-2\sigma_0/gv$) at which its free energy G becomes the maximum (critical nucleus), G is reduced and the nucleus continues to grow three-dimensionally and become shaped in an island. The nucleus with a size exceeding rc is called "stable nucleus" and in the basic description of the present invention hereinbelow, "nucleus" unless otherwise specifically noted indicates the "stable nucleus".

Also, of the "stable nucleus", one with small r is called "initial nucleus". The free energy G formed by formation of the nucleus is represented by:

$$G = 4\pi f(\theta)(\sigma_0 r^2 + \tfrac{1}{3} g v \cdot r^3)$$

$$f(\theta) = \tfrac{1}{4}(2 - 3\cos\theta + \cos^2\theta)$$

where
r: radius of curvature of nucleus
$\theta$: contact angle of nucleus
gv: free energy per unit volume
$\sigma_0$: surface energy between nucleus and vacuum.

Figure 1:
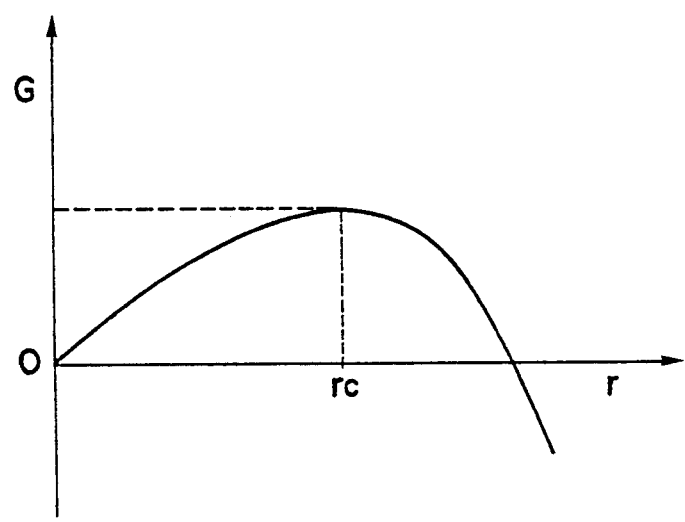
FIG. 1 illustrates the relationship between nucleus size rc and free energy G in the thin film forming process.

The manner in which G is changed is shown in FIG. 1. In FIG. 1, the curvature of radius of the stable nucleus when G is at the maximum value is rc.

Thus, the nucleus grows to become shaped in an island, and further grows until contact mutually between islands proceeds, giving rise to coalescence in some cases, finally forming via a network structure a continuous film to cover completely the substrate surface. Through such process, a thin film is deposited on the substrate.

In the deposition process as described above, the density of the nucleus formed per unit area of the substrate surface, the size of the nucleus and the nucleation speed are determined depending on the state of the system of deposition, and particularly the interaction between the flying atoms and the substrate surface substance is an important factor. Also, a specific crystal orientation grows in parallel to the substrate depending on the anisotropy relative to the crystal face of the interfacial energy at the interface between the deposited substance and the substrate, and when the substrate is amorphous, the crystal directions within the substrate plane are not constant. For this reason, a grain boundary is formed by collision mutually between nuclei or islands. Particularly, if it is collision mutually between islands with certain sizes or greater, coalescence will occur, leading directly to formation of a grain boundary. The grain boundary formed can be migrated with difficulty in the solid phase, and therefore the grain size is determined at that point.

Next, the selective deposition method for forming selectively a deposited film on the deposition surface is to be described. The selective deposited film forming method is a method in which a thin film is selectively formed on the substrate by utilizing the difference between the materials in the factors influencing nucleation in the thin film forming process such as surface energy, attachment coefficient, elimination coefficient, surface diffusion speed, etc.

Figure 2A:
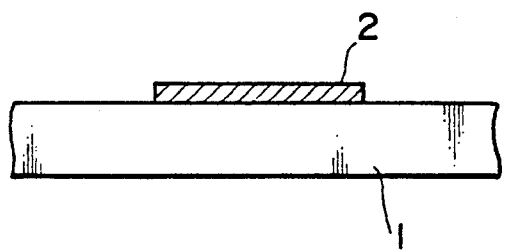
FIGS. 2A and 2B illustrate the selective deposition method.
Figure 2B:
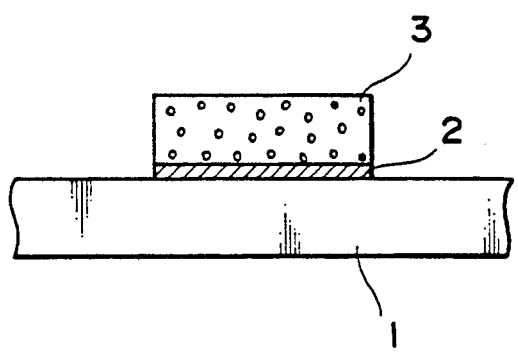

FIGS. 2A and 2B illustrate schematically the selective deposited film forming method. First, as shown in FIG. 2A, on the substrate 1, a thin film 2 comprising a material different in the above factors from the substrate 1 is formed at a desired portion. And, when deposition of a thin film comprising an appropriate material is performed according to appropriate deposition conditions, it becomes possible to cause a phenomenon to occur such that the thin film 3 will grow only on the free surface of the thin film 2 without growth on the substrate 1. By utilizing this phenomenon, the thin film 3 formed self-matchingly can be permitted to grow, whereby the lithography step by use of a resist as practiced in the prior art can be omitted.

As the materials which can be deposited by such selective deposited film formation method, there may be included, for example, $SiO_2$ as the substrate 1, Si, GaAs, silicon nitride as the thin film 2, and Si, W, GaAs, InP, etc. as the thin film 3 to be deposited.

The III-V group compound crystal can be grown on a Si substrate, a III-V group compound substrate, and cannot be easily grown on a $SiO_2$ substrate as is known in the art. However, by implanting ions of the group III elements, the group V elements of Periodic Table, or ions of the group II elements, the group VI elements of Periodic Table in a $SiO_2$ substrate, the nucleation density (ND) at the ion implanted portion can be enhanced to make the difference ($\Delta ND$) in nucleation density from the $SiO_2$ substrate sufficiently large, whereby selective deposition of the group III-V group compound can be effected.

Also, it is possible to add a different material having larger nucleation density ($ND_L$) to the material surface having smaller nucleation density ($ND_S$) such as $SiO_2$ and selectively effect deposited film formation by utilizing the nucleation density difference ($\Delta ND$).

The present invention utilizes the selective deposition method based on such nucleation density difference ($\Delta ND$), and a nucleation surface comprising a material which is sufficiently larger in nucleation density than and is different than the material forming the deposition surface (crystal forming surface) is formed sufficiently finely so that only a singly nucleus may grow, whereby a monocrystal is grown selectively only at such fine nucleation surface.

Since the selective growth of monocrystal is determined depending on the electron state of the nucleation surface, particularly the state of dangling bond, the material with lower nucleation density forming the nucleation surface (e.g. SiO$_2$) is not required to be a bulk material, but the nucleation surface may be formed on the surface of a substrate of any desired material.

In the following, the present invention is described in detail by referring to the drawings.

Figure 3A:
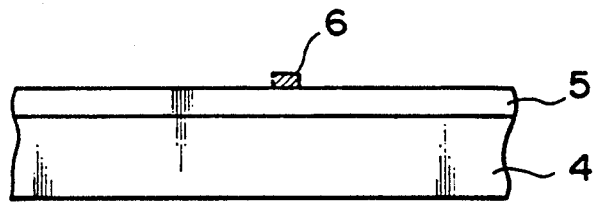
FIGS. 3A-3D illustrate the formation steps showing a first embodiment of the process for forming a crystal according to the present invention.
Figure 3B:
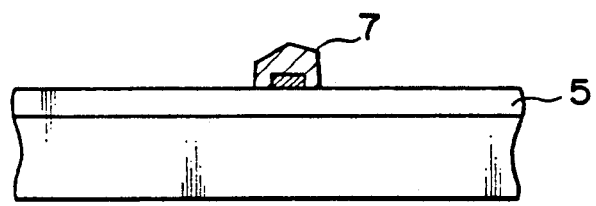
Figure 3C:
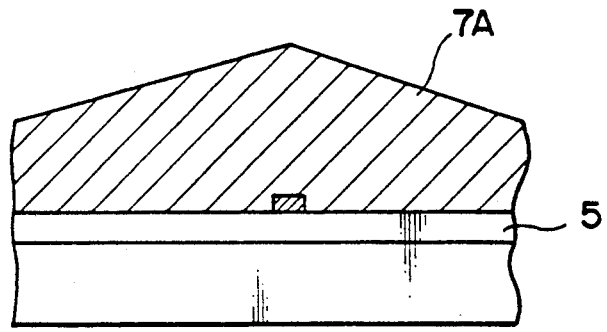
Figure 3D:
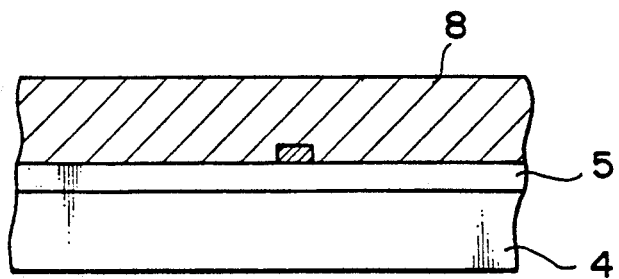
Figure 4A:
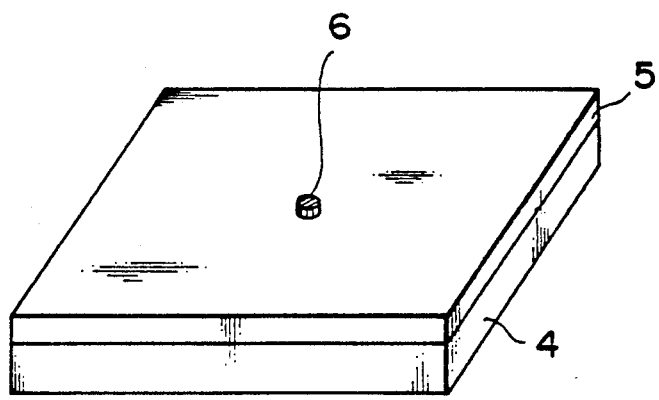
FIGS. 4A and 4B are perspective views of the substrate in FIGS. 3A and 3D.
Figure 4B:
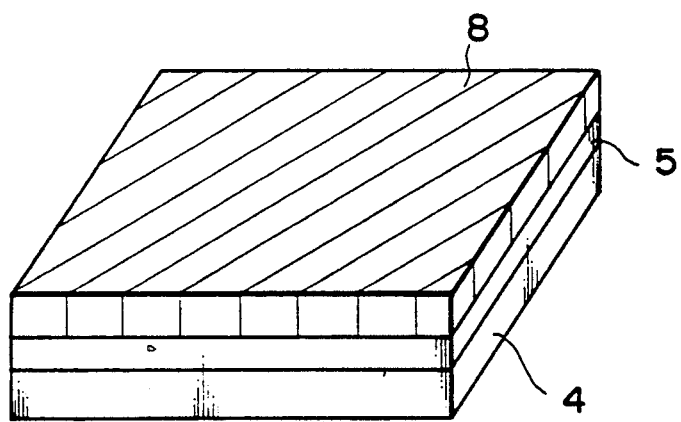
Figure 5A:
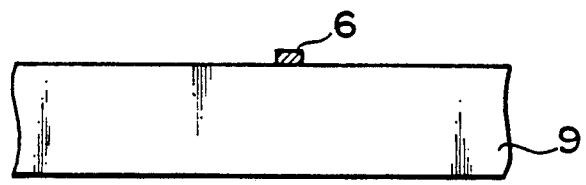
FIGS. 5A-5D illustrate the formation steps showing a second embodiment of the process for forming a crystal according to the present invention.
Figure 5B:
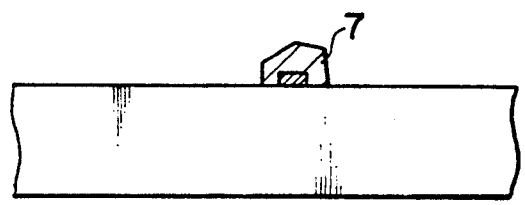
Figure 5C:
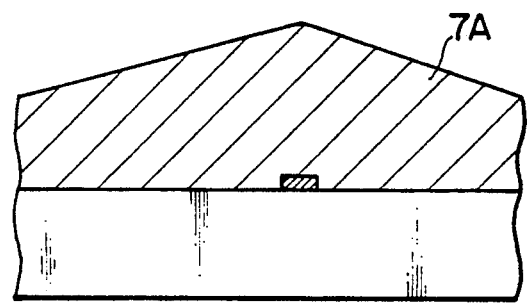
Figure 5D:
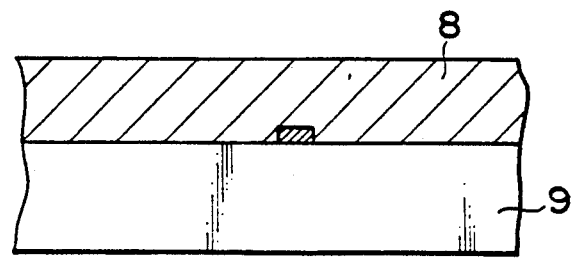

FIGS. 3A–3D illustrate diagramatically the steps of formation process of the crystal showing a first embodiment according to the present invention, and FIGS. 4A and 4B are perspective views in FIGS. 3A and 3D.

First, as shown in FIG. 3A and FIG. 4A, on the substrate 4, which is made of a high temperature resistant material such as high-melting point glass, quartz, alumina, ceramics, etc., a thin film with small nucleation density enabling selective nucleation 5 [non-nucleation surface (S$_{NDS}$)] is formed, and a material different from the material forming the thin film 5 with small nucleation density is thinly deposited thereon, followed by patterning by lithography, etc. to form sufficiently finely a nucleation surface comprising a different material (S$_{NDL}$) (or called "Seed") 6, thereby obtaining a substrate for crystal formation. However, the size, the crystal structure and the composition of the substrate 4 may be as desired, and it may be also a substrate having a functional element already formed thereon according to conventional semiconductor technique. Also, the nucleation surfaces (S$_{NDL}$) 6 comprising a different material is inclusive of modified regions formed by ion implantation of Ga, As, etc. on the thin film 5, as described above. Furthermore, the nucleation surface (S$_{NDL}$) may be a surface on which a nucleus can be substantially formed, and is constituted of an amorphous material.

Next, by selecting appropriate deposition conditions, a monocrystal of a thin film material is formed only on the nucleation surface (S$_{NDL}$) 6. That is, the nucleation surface (S$_{NDL}$) 6 is required to be formed sufficiently fine to the extent that only a single nucleus may be formed. The size of the nucleation surface (S$_{NDL}$) 6, which depends on the kind of the material, may be several micrometers or less. Further, the nucleus grows while maintaining a monocrystal structure to become a monocrystal grain 7 shaped in an island as shown in FIG. 3B. For the island-shaped monocrystal grain 7 to be formed, the conditions for crystal formation treatment are desirable to determine the conditions so that no nucleation may occur at all on the free surface of the thin film 5.

The island-shaped monocrystal grain 7 further grows while maintaining the monocrystal structure with the nucleation surface (S$_{NDL}$) 6 as the center (lateral overgrowth), whereby the thin film 5 can be partially or wholly covered therewith as shown in FIG. 3C (monocrystal 7A).

Subsequently, the surface of the monocrystal 7A is flattened by etching or polishing to form a monocrystal layer 8 on the thin film 5, by which a desired element can be formed, as shown in FIG. 3D or FIG. 4B.

Thus, since the thin film 5 constituting the non-nucleation surface (S$_{NDS}$) is formed on the substrate 4, any desired material can be used for the substrate 4 which is the supporting member. Further, in such case, even if the substrate 4 may be one having a functional element, etc. formed by semiconductor technique, a monocrystal layer 8 can be easily formed thereon.

In the above embodiment, the non-nucleation surface (S$_{NDS}$) was formed with the thin film 5. However, as shown in FIGS. 5A–5D, a substrate comprising a material with small nucleation density (ND) enabling selective nucleation may be used as such, and a substrate for crystal formation may be prepared by providing a nucleation surface (S$_{NDL}$) at any desired position thereof.

FIGS. 5A–5D are diagrams of the formation steps of the crystal showing a second embodiment of the present invention. As shown in FIGS. 5A–5D, by forming a nucleation surface (S$_{NDL}$) 6 comprising a material with larger nucleation density (ND) sufficiently finely on a substrate 9 comprising a material with smaller nucleation density (ND) enabling selective nucleation to provide a substrate for crystal formation, a monocrystal layer 8 can be formed thereon similarly as in the first embodiment.

Figure 6A:
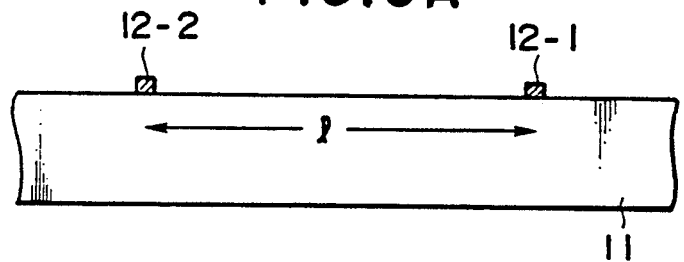
FIGS. 6A-6D illustrate the formation steps showing a third embodiment of the process for forming a crystal according to the present invention.
Figure 6B:
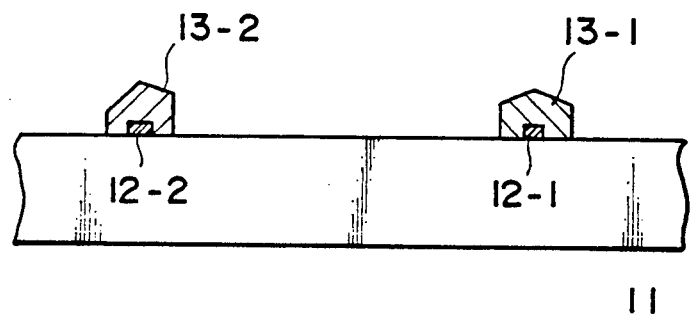
Figure 6C:
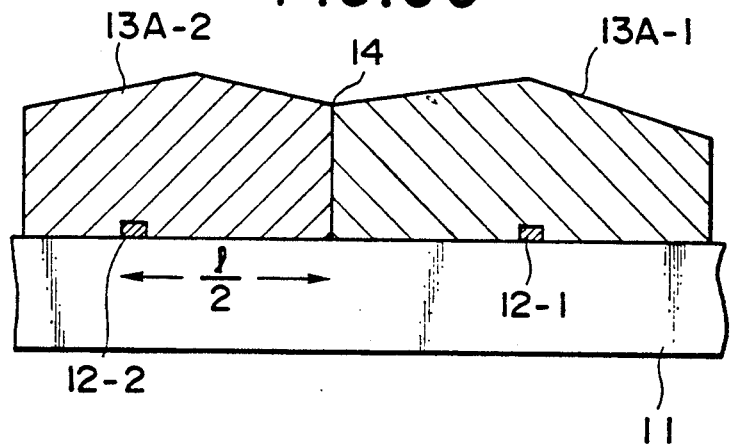
Figure 6D:
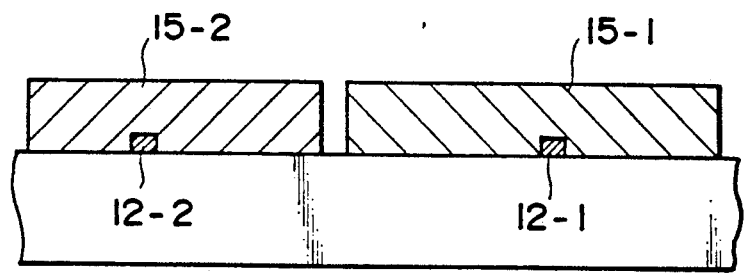
Figure 7A:
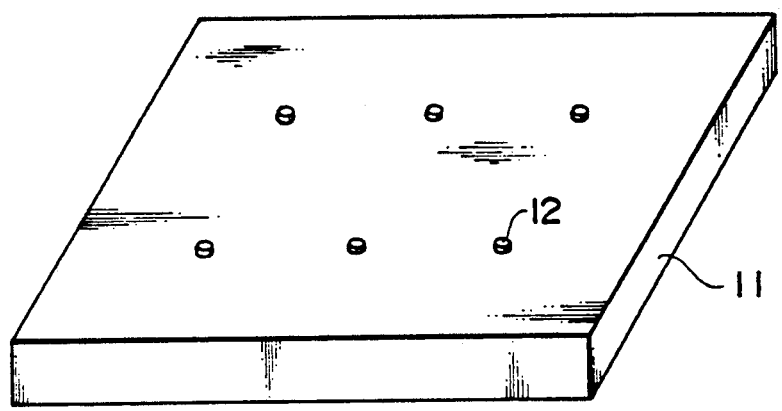
FIGS. 7A and 7B are perspective views of the substrate in FIGS. 6A and 6D.
Figure 7B:
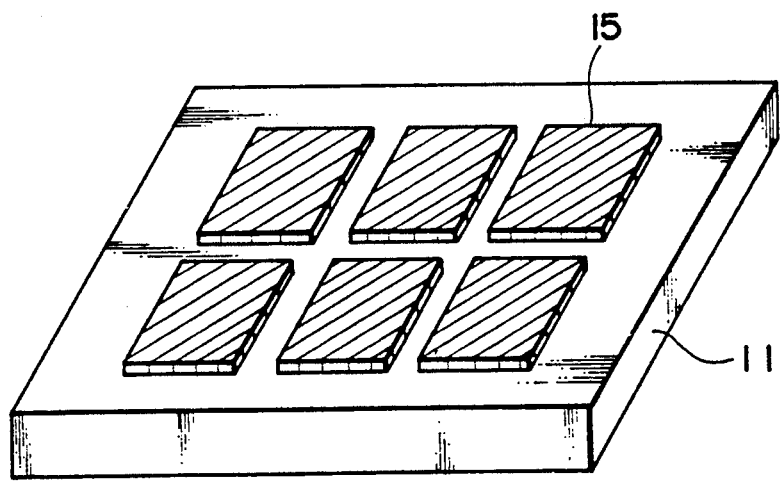

FIGS. 6A–6D are diagrams of the formation steps showing a third embodiment of the process for forming the crystal according to the present invention, and FIGS. 7A and 7B are perspective views of FIGS. 6A and 6D.

As shown in FIGS. 6A and FIG. 7A, on an amorphous insulating material substrate 11, nucleation surfaces (S$_{NDL}$) 12-1, 12-2 are arranged sufficiently finely with a material different from the material of the substrate 11 with a distance l therebetween. The distance l may be set equal to or greater than the size of the monocrystalline region required for formation of, for example, a semiconductor element or a group of semiconductor elements.

Next, by selecting appropriate crystal forming conditions, only one nucleus of the crystal forming material is formed on only the nucleation surfaces (S$_{NDL}$) 12-1, 12-2, respectively. That is, the nucleation surfaces (S$_{NDL}$) 12-1, 12-2 are required to be formed to sufficiently fine sizes (areas) to the extent that only a single nucleus may be formed. The sizes of the nucleation surfaces (S$_{NDL}$) 12-1, 12-2, which may differ depending on the kind of the material, may be preferably 10 μm or less, more preferably 5 μm or less and most preferably 1 μm or less. Further, the nucleus grows while maintaining a monocrystal structure to become island-shaped grains 13-1, 13-2 as shown in FIG. 6B. For island-shaped monocrystal grains 13-1, 13-2 to be formed, as already mentioned, it is desirable to determine the conditions for crystal forming treatment so that no nucleation will occur at all on other surfaces than the nucleation surfaces (S$_{NDL}$) on the substrate 11.

The crystal orientations of the island-shaped monocrystal grains 13-1, 13-2 in the normal direction of the substrate 11 are constantly determined so as to make minimum the interface energy of the material of the substrate 11 and the material forming the nucleus. This is because, the surface or the interface energy has anisotropy depending on the crystal face. However, as already mentioned, the crystal orientation within the substrate plane of an amorphous substrate cannot be determined.

,The island-shaped monocrystal grains 13-1, 13-2, further grow to become monocrystals 13A-1, 13A-2, whereby adjoining monocrystals 13A-1, 13A-2 contact mutually each other as shown in FIG. 6C, but since the crystal orientation within the substrate plane is not constant, a crystal grain boundary 14 is formed in the middle portion between the nucleation surfaces (S$_{NDL}$) 12-1 and 12-2.

Subsequently, monocrystals 13A-1, 13A-2 grow three-dimensionally, but the crystal face with slower growth speed will appear as facet. For this reason, flattening of the surfaces of monocrystals 13A-1, 13A-2 is performed, and further the portion including the grain boundary 14 is removed, to form the thin films 15-1, 15-2 of monocrystals each containing no grain boundary in shape of lattice as shown in FIGS. 6D and 7B. The sizes of the monocrystal thin films 15-1, 15-2 are determined by the distance 1 of the nucleation surface ($S_{NDL}$) 12 as described above. That is, by defining appropriately the formation pattern of the nucleation surface ($S_{NDL}$) 12, the position of the grain boundary can be controlled to form monocrystals with desired sizes at a desired arrangement.

FIGS. 8A–8D illustrate the steps of forming a crystal showing a fourth embodiment of the present invention. As shown in the same Figures, similarly as in the first embodiment is formed on a desired substrate 4 a thin film non-nucleation surface ($S_{NDS}$) 5 comprising a material with smaller nucleation density (ND), and a nucleation surface ($S_{NDL}$) 12 comprising a different material with larger nucleation density thereon with a distance of 1 to provide a substrate, whereby a monocrystal layer 15 can be formed thereon in the same manner as in the above third embodiment.

Figure 9A:
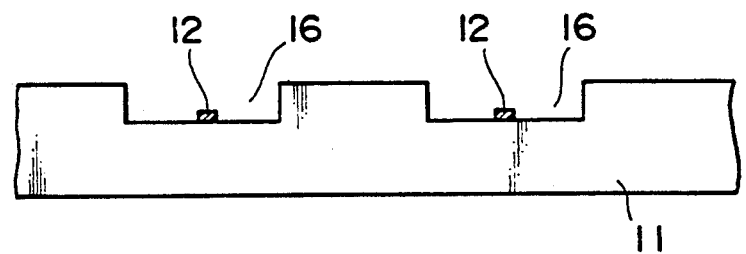
FIGS. 9A-9C illustrate the formation steps showing a fifth embodiment of the process for forming a crystal according to the present invention.
Figure 9B:
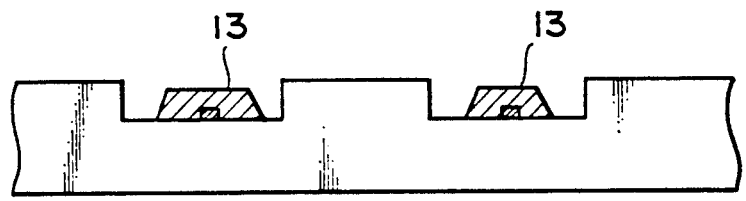
Figure 9C:
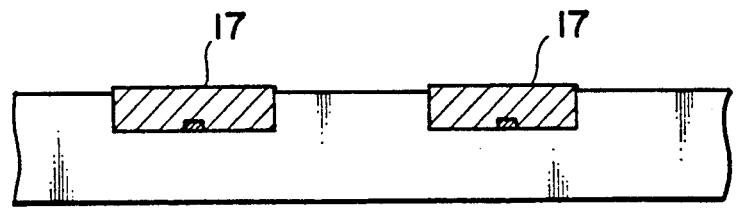
Figure 10A:
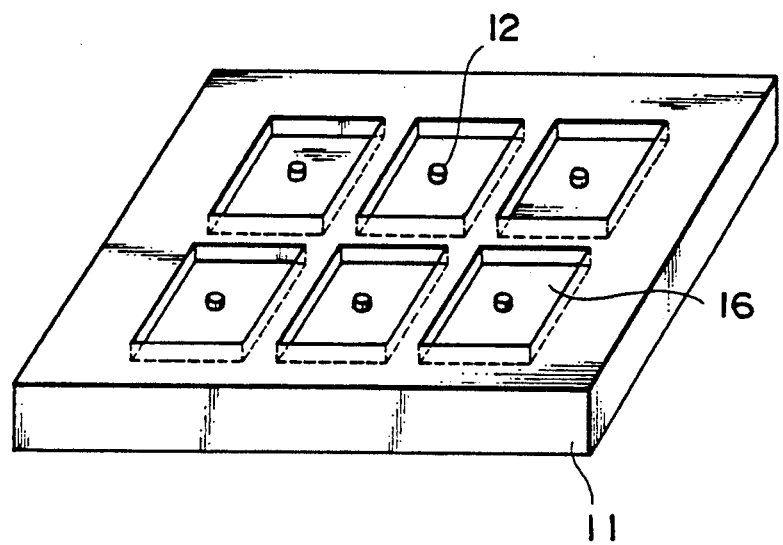
FIGS. 10A and 10B are perspective views of the substrate in FIGS. 9A and 9C.
Figure 10B:
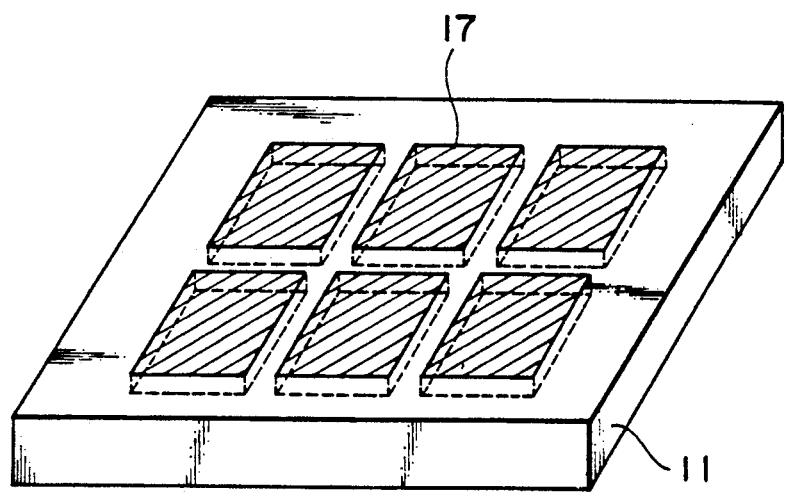

FIGS. 9A–9C illustrate the steps of forming a crystal according to the process of the present invention showing a fifth embodiment, and FIGS. 10A and 10B are perspective views in FIGS. 9A and 9C.

First, as shown in FIGS. 9A and 10A, a concavity 16 with desired size and shape is formed on an amorphous insulating substrate 11, and a nucleation surface ($S_{NDL}$) 12 with sufficiently fine area size capable of forming only a single nucleus is formed therein.

Subsequently, as shown in FIG. 9B, an island-shaped monocrystal grain 13 is grown in the same manner as in the first embodiment.

And, as shown in FIGS. 9C and 10B, the monocrystal grain 13 is grown until embedding the concavity 16 to form a monocrystal layer 17.

In this embodiment, since the monocrystal grain 13 grows within the concavity 16, the steps of flattening and removing the grain boundary portion become unnecessary.

Figure 11A:
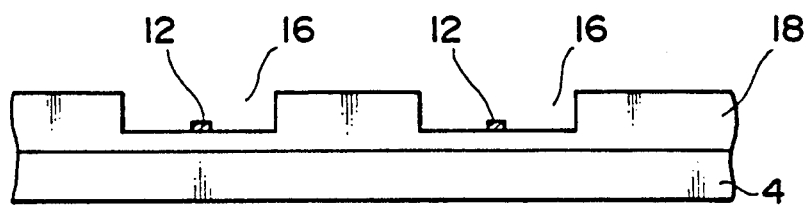
FIGS. 11A-11C illustrate the formation steps showing a sixth embodiment of the process for forming a crystal according to the present invention.
Figure 11B:
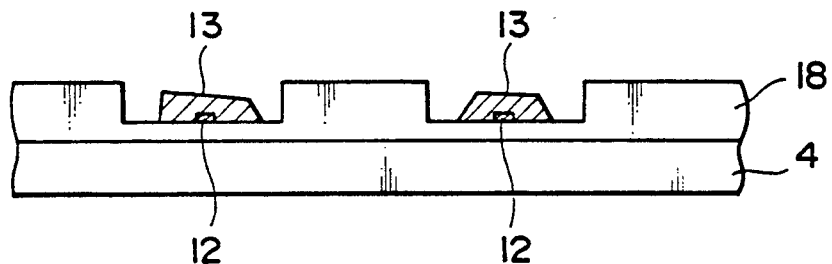
Figure 11C:
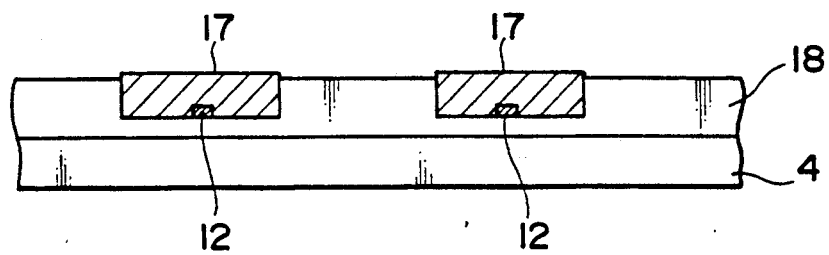

FIGS. 11A–11C illustrate the steps of forming a crystal showing a sixth embodiment of the present invention. As shown in the same Figures, on any desired substrate 4 similar to the first embodiment, a thin film non-nucleation surface ($S_{NDS}$) 18 comprising a material with smaller nucleation density (ND) is formed, and a concavity 16 with desired size and shaped is formed thereat. And, in the concavity is formed in a fine area a nucleation surface ($S_{NDL}$) 12 comprising a material which is different from the material forming the non-nucleation surface ($S_{NDS}$) and having larger nucleation density (ND), and a monocrystal layer 17 is formed similarly as in the fifth embodiment.

Figure 12A:
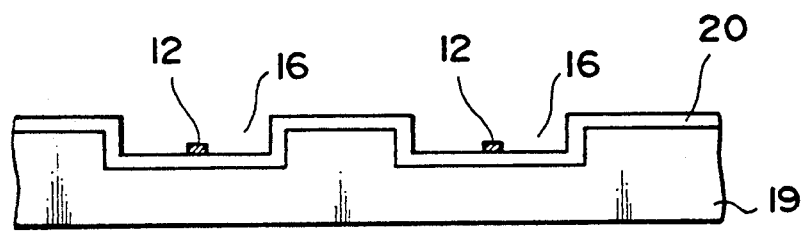
FIGS. 12A-12C illustrate the formation steps showing a seventh embodiment of the process for forming a crystal according to the present invention.
Figure 12B:
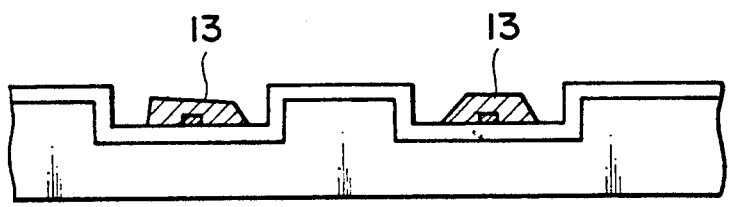
Figure 12C:
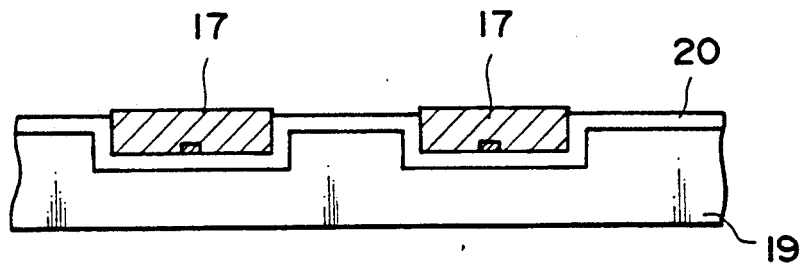

FIGS. 12A–12C illustrate the steps forming a crystal showing a seventh embodiment of the present invention. After a concavity is formed on a desired substrate 19, a thin film non-nucleation surface ($S_{NDS}$) 20 comprising a material with sufficiently small nucleation density ($N_D$) is formed, and following the same procedure as in the above embodiments, a monocrystal layer 17 can be formed.

FIGS. 13A–13D illustrate the steps of forming a crystal showing an eighth embodiment of the present invention.

Figure 13A:
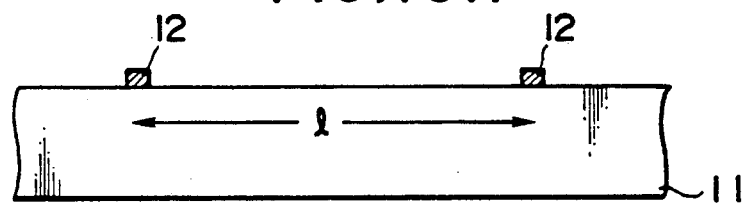
FIGS. 13A-13D illustrate the formation steps showing an eighth embodiment of the process for forming a crystal according to the present invention.
Figure 13B:
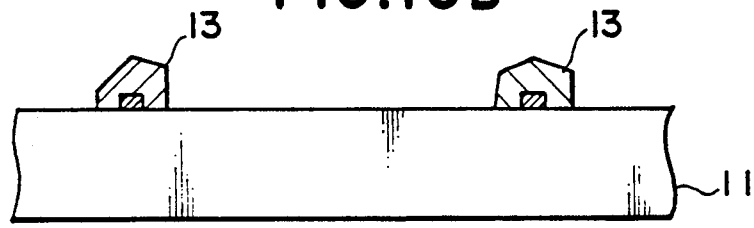
Figure 13C:
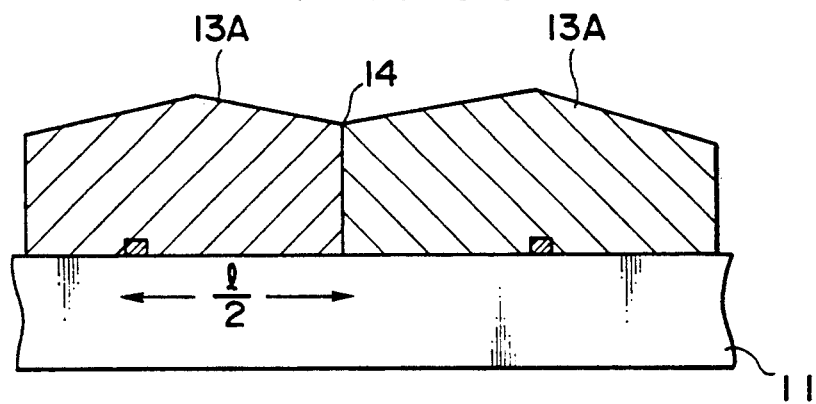
Figure 13D:
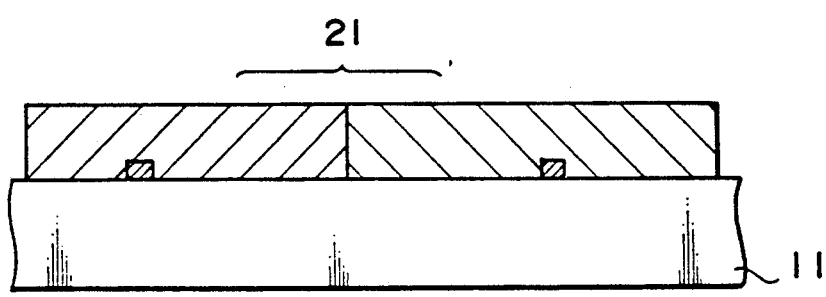

FIGS. 13A–13C are the same as FIGS. 6A–6C. That is, a plural number (two in the Figures) of nucleation surfaces 12 are formed with an interval of 1 to form monocrystal grains 13 subjected to overgrowth on the nucleation surface 12. By growing further the monocrystal grains 13 to form monocrystals 13A, a grain boundary 14 is formed at approximately the center of the nucleation surfaces ($S_{NDL}$) 12, and by flattening the surface of the monocrystal 13A, a polycrystalline layer 21 with grain sizes being substantially regularly 1 as shown in FIG. 13D can be obtained.

Since the grain size of the polycrystalline layer 21 is determined by the interval 1 between the nucleation surfaces ($S_{NDL}$) 12, it becomes possible to control the grain size of the polycrystal. In the prior art, the grain size of a polycrystal was changed depending of a plurality of factors such as the formation method, the formation temperature, etc., and when a polycrystal with a large grain size is to be prepared, it had a grain size distribution with a considerable width. According to the present invention, the grain size and the grain size distribution can be determined with good controllability by the interval 1 between the nucleation surfaces 12.

Of course, as shown in FIGS. 8A–8D, the above polycrystalline layer 21 may be formed by forming a non-nucleation surface ($S_{NDS}$) 5 with smaller nucleation density and nucleation surfaces ($S_{NDL}$) 12-1, 12-2 on a desired substrate 4. In this case, as already described, the polycrystalline layer 21 can be formed with controlled grain size and grain size distribution without restrictions with respect to the material, structure, etc. of the substrate.

In the following, specific processes for forming the monocrystal layer or polycrystal layer in the above embodiments are described in more detail.

EXAMPLE 1

Referring to FIG. 14, the process for forming GaAs film on $SiO_2$ is described as a first example of the present invention.

First, on a substrate 4 made of a high melting glass, a $SiO_2$ film 5 was deposited to about 1000 Å by the conventional CVD (chemical vapor deposition) by use of silane ($SiH_4$) and oxygen ($O_2$). The nucleation density (NDs) of GaAs on the $SiO_2$ film is small, and the $SiO_2$ film 5 forms the non-nucleation surface ($S_{NDS}$). In place of forming a $SiO_2$ film on the substrate 4, the substrate 4 per se may be constituted of a material such as $SiO_2$, alumina, etc.

Next, the surface of the $SiO_2$ film 5 was masked with a photoresist to a desired pattern.

By use of an ion implanter, As ions were implanted to the side of the photoresist-masked $SiO_2$ film. The As ions were implanted only on the surface of the $SiO_2$ film exposed [FIG. 14A]. The amount implanted was $2.5 \times 10^{16}/cm^2$ or more. At the $SiO_2$ film surface where no As is implanted, the nucleation density (NDs) of GaAs is small, and this portion becomes the non-nucleation surface ($S_{NDS}$). On the other hand, the regions 12-1, 12-2 where As ions are implanted have larger nucleation density ($ND_L$) than the non-nucleation surface ($S_{NDS}$), which portions become nucleation surfaces ($S_{NDL}$). At this time, when the size of the ion implanted portion was made 1.2 μm square. Thus, the substrate for forming a crystal was prepared.

After the photoresist was peeled off from the $SiO_2$ film, the substrate was subjected to heat treatment in a $H_2$ atmosphere at about 900° C. for about 10 minutes to clean the surface.

Figure 14A:
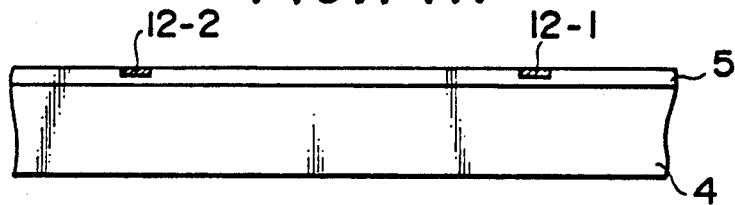
FIGS. 14A-14D illustrate the steps of forming a crystal showing an example of the present invention.
Figure 14B:
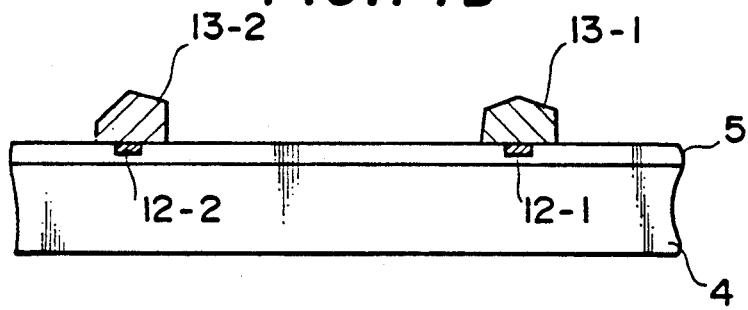

Subsequently, while the substrate was heated to 600° C., trimethyl gallium ($Ca(CH_3)_3$, hereinafter referred to as TMG) and arsine (AsH$_3$) at a molar ratio of 1:60 were flowed together with a carrier gas H$_2$ onto the substrate surface to grow a GaAs crystal thereon according to the MOCVD (organometallic chemical vapor deposition) method. The reaction pressure was made about 20 Torr. This state was maintained for a certain period, and then a single nucleus was formed on each of the regions 12-1, 12-2 surfaces, and in each single nucleus the growth of a single crystal started. Thus, as shown in FIG. 14B, GaAs crystals 13-1, 13-2 was grown on the nucleation surfaces (S$_{NDL}$) 12-1, 12-2 formed by implantation of As ions, and no GaAs crystal was grown on the non-nucleation surface (S$_{NDS}$), namely the SiO$_2$ film surface where no As was implanted.

Figure 14C:
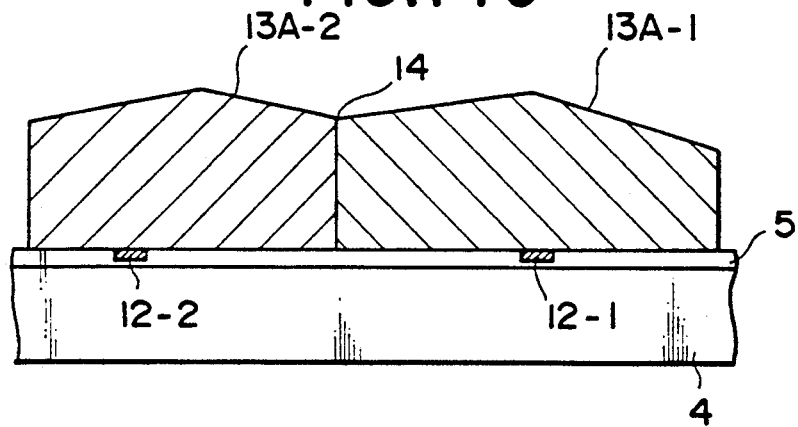
Figure 14D:
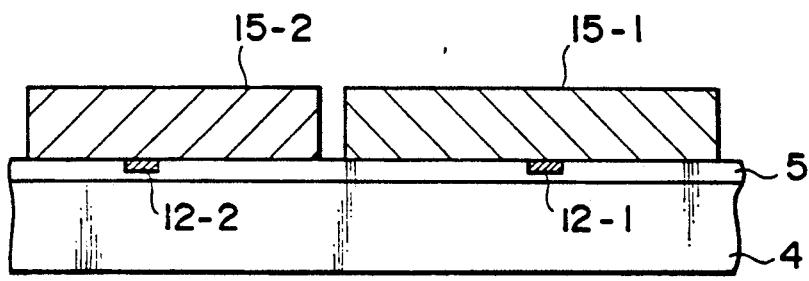

Growth of the GaAs crystals 13-1 and 13-2 were further continued, and the GaAs crystals 13A-1, 13A-2 became to contact each other as shown in FIG. 14C. At that stage, the growth of the crystals (interruption of crystal forming, operation) was stopped. The surfaces of the GaAs crystals 13A-1 and 13A-2 were polished and the grain boundary was etched, and then GaAs crystals 15-1, 15-2 as shown in FIG. 14D were obtained. A substrate temperature was 600° C. and a reaction pressure was 50 Torr.

The GaAs monocrystal 15-1, 15-2 thus obtained were evaluated by observation with an electron microscope and X-ray diffraction. As the result, for each of the monocrystals 15-1, 15-2, 50×100 GaAs monocrystal, with grain size of 80 μm and substantially without grain size distribution, were found to be formed on the substrate.

All of these GaAs monocrystals are shown to have monocrystal characteristics of extremely good quality.

EXAMPLE 2

Referring to FIG. 8, a second example of the present invention is described.

First, on the surface of a substrate 4 made of ceramics, an SiO$_2$ film 5 was deposited to about 1000 Å according to the thermal CVD method by use of SiH$_4$ and O$_2$.

Next, by means of an arc discharge type ion plating device, on the SiO$_2$ film 5 was deposited an Al$_2$O$_3$ film. Upon the deposition, after the device was internally evacuated to 10$^{-5}$ Torr, O$_2$ gas was introduced to 3×10$^{-4}$ Torr in partial pressure, and an ionization voltage was set at 50 V, a substrate potential at −50 V and an output at 500 W. Thus, an Al$_2$O$_3$ film was deposited to about 300 Å on the SiO$_2$ film 5. According to the electron ray diffraction analysis, the Al$_2$O$_3$ film was found to be amorphous.

Figure 8A:
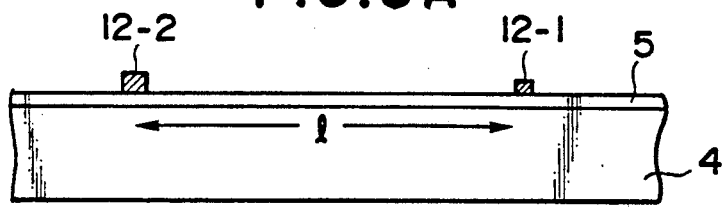
FIGS. 8A-8D illustrate the formation steps showing a fourth embodiment of the process for forming a crystal according to the present invention.
Figure 8B:
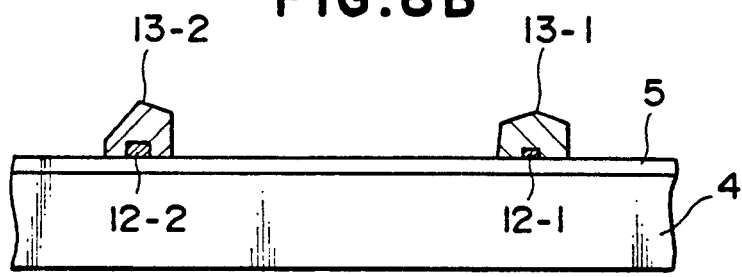
Figure 8C:
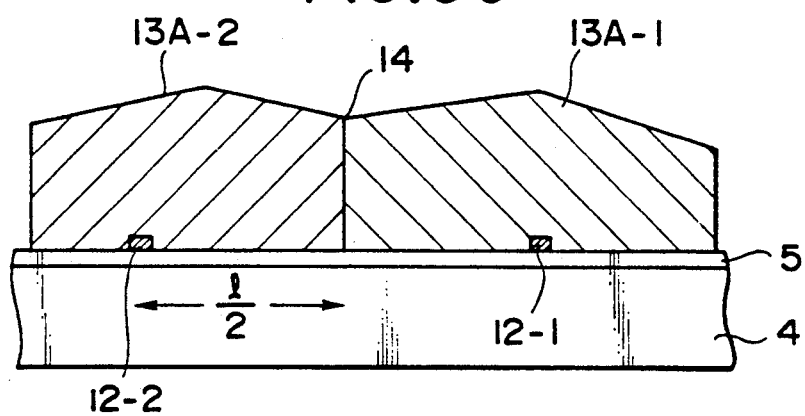
Figure 8D:
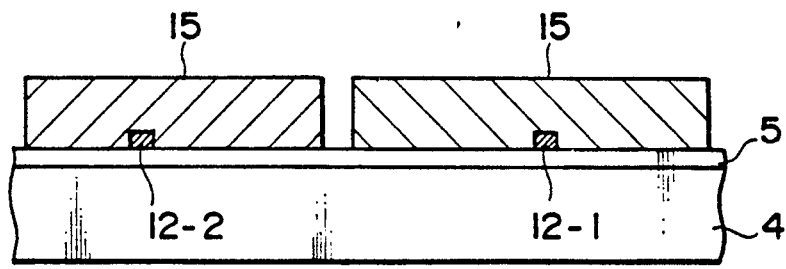

With a photoresist masked to a desired pattern on the Al$_2$O$_3$ film, the portion with the Al$_2$O$_3$ film exposed was etched with an etchant of H$_3$PO$_4$:HNO$_3$:CH$_3$COOH:H$_2$O=16:1:2:1 to form nucleation surfaces 12-1, 12-2 (see FIG. 8A). At this time, the substrate 4 was heated to about 40° C. The size of the nucleation surface 12-1, 12-2 was made 1.2 μm square. Thus, the substrate for forming a crystal was prepared.

Then, after the photoresist was peeled off, the substrate was subjected to heat treatment in a H$_2$ atmosphere at about 900° C. for about 10 minutes to clean the surface. On the SiO$_2$ surface 5, nucleation density (NDs) of GaAs is small, which portion becomes the non-nucleation surface (S$_{NDS}$). On the other hand, Al$_2$O$_3$ films 12-1, 12-2 have larger nucleation density (ND$_L$) than the non-nucleation surface (S$_{NDS}$) 5, which portion becomes the nucleation surface (S$_{NDL}$).

Subsequently, while the substrate was heated to 600° C., trimethyl gallium (TMG) and arsine (AsH$_3$) at a molar ratio of 1:60 were flowed together with a carrier gas H$_2$ onto the substrate surface to grow a GaAs film according to the MOCVD (organometallic chemical vapor deposition) method. The reaction pressure was made about 20 Torr. GaAs crystals 13-1, 13-2 were grown only on the Al$_2$O$_3$ nucleation surfaces (S$_{NDL}$) 12-1, 12-2, and no nucleus sufficient to grow a crystal was formed on the non-nucleation surface (S$_{NDS}$) 5, namely the SiO$_2$ surface.

When the crystal-growing operation was further continued, GaAs crystals of good quality were obtained similarly as in Example 1. A substrate temperature was 600° C. and a reaction pressure was 50 Torr.

EXAMPLE 3

On the surface of a substrate resistant to high temperature comprising ceramics, etc., an Al$_2$O$_3$ film was deposited to about 300 Å by means of an arc discharge type ion plating device.

Next, a SiO$_2$ film was deposited to about 1000 Å according to the thermal CVD method by use of SiH$_4$ and O$_2$.

With a photoresist masked to a desired pattern on the SiO$_2$ film, the portion of the SiO$_2$ film exposed was etched according to reactive etching by use of CHCl$_2$F to form a nucleation surface having a part of the Al$_2$O$_3$ partially exposed. At this time, the substrate was heated to about 400° C. The size of the nucleation surface was made 1.2 μm square. Thus, the substrate for forming a crystal was prepared.

After the photoresist was peeled off, the substrate was subjected to heat treatment in an H$_2$ atmosphere at about 900° C. for about 10 minutes to clean the surface. On the SiO$_2$ film surface, nucleation density (NDs) of GaAs is small, which portion becomes the non-nucleation surface (S$_{NDS}$). On the other hand, Al$_2$O$_3$ film has larger nucleation density (ND$_L$) than the non-nucleation surface (S$_{NDS}$), which portion becomes the nucleation surface (S$_{NDL}$).

Subsequently, while the substrate was heated to 600° C., trimethyl gallium (TMG) and arsine (AsH$_3$) at a molar ratio of 1:60 were flowed together with a carrier gas H$_2$ onto the substrate surface to grow a GaAs monocrystal according to the MOCVD (organometallic chemical vapor deposition) method. The reaction pressure was made about 20 Torr. A GaAs crystal was grown around its single nucleus formed only on the Al$_2$O$_3$ nucleation surface (S$_{NDL}$), and such a growth of a GaAs crystal was not found on the non-nucleation surface (S$_{NDS}$), namely the SiO$_2$ film surface.

When the crystal-growing operation was further continued, GaAs crystals of good quality were obtained similarly as in Example 1.

EXAMPLE 4

On a quartz substrate, a silicon nitride film was deposited to about 300 Å thick according to the plasma CVD method. At this time, H$_2$, SiH$_4$ and NH$_3$ were flowed at the ratio of 8:2:5, and a reaction pressure was 0.16 Torr, RF power was 10 W and a substrate temperature was 300° C.

Then, patterning was performed with a photoresist. The size of the silicon nitride film was made 1.2 μm square. Remaining small area of the silicon nitride film becomes a nucleation surface and the surface of the quartz substrate exposed becomes a non-nucleation surface.

After the photoresist was peeled off, the substrate was subjected to heat treatment at about 900° C. for 10 min. under $H_2$ atmosphere to clean the surface. Thus, the substrate for forming a crystal was prepared.

While the substrate was heated to 600° C., trimethyl gallium (TMG) and arsine ($AsH_3$) at a mole ration of 1:60 were flowed together with a carrier gas, $H_2$ onto the substrate surface to grow a GaAs film according to the MOCVD (organometallic chemical vaper deposition). The reaction pressure was about 20 Torr. GaAs crystal was grown around its single nucleus only formed on the silicon nitride nucleation surface ($S_{NDL}$). No nucleus for the growth of a crystal was not formed on the non-nucleation surface, namely the quartz surface.

EXAMPLE 5

A GaAlAs mixed crystal III-V group compound monocrystal was selectively formed as below.

After deposition of $SiO_2$ film 5 to about 1000 Å on a substrate 4 (high melting glass) according to the thermal CVD method by use of $SiH_4$ and $O_2$ in the same manner as in Example 1, with a photoresist masked to a desired pattern on the $SiO_2$ film surface, As ions were implanted into the exposed $SiO_2$ film at $2.5 \times 10^{16}/cm^2$ by use of an ion implanter. The size of each of the implanted regions 12-1, 12-2 was made 1.2 μm square. Thus, the substrate for forming a crystal was prepared.

Next, the resist film was peeled off, and the substrate was subjected to heat treatment in a $H_2$ atmosphere at about 900° C. for about 10 minutes to clean the surface.

Also for the GaAlAs mixed crystal, the $SiO_2$ portion implanted with no As ions has smaller nucleation density (NDs) to become the non-nucleation surface ($S_{NDS}$). On the other hand, the portions 12-1, 12-2 implanted with As ions have larger nucleation density ($ND_L$) to become the nucleation surface ($S_{NDL}$).

Onto the surface where the nucleation surfaces ($S_{NDL}$) 12-1, 12-2 and the non-nucleation surface ($S_{NDS}$) thus having a nucleation density difference (ΔND) exist, by use of $H_2$ as the carrier gas, TMG, trimethylaluminum (TMAl) and $AsH_3$ were flowed at a ratio of (TMG+TMAl):$AsH_3$ of 1:10-20 (molar ratio). The substrate temperature was made 800° C. by heating. The reaction pressure were made 30 Torr. Similarly as shown in FIG. 14B, only on the nucleation surface ($S_{NDL}$) formed by implantation of As ions, the ternary mixed crystal III-V group compound GaAlAs monocrystal was formed selectively. When the crystal-growing operation was continued, the monocrystals 13A-1, 13A-2 were grown as shown in FIG. 14C. The size of each of the monocrystals was about 80 μm, and the crystallinity was good. The substrate temperature was 750° C. and the reaction pressure was 40 Torr.

In this case, the ratio of Ga and As in GaAlAs can be freely controlled by varying the ratio of the reactive gases TMG and TMAl.

As shown above in Examples, according to the present invention, a single nucleus is formed on a nucleation surface ($S_{NDL}$) of several μm or less having larger nucleation density ($ND_L$), and a compound semiconductor monocrystal belonging to the group III-V of the periodic table can be grown only from the single nucleus.

In the above Examples, there are shown examples in which $SiO_2$ film is formed by the CVD method, but $SiO_2$ film can be also formed according to the sputtering method. Further, quartz itself with its surface well flattened can be also used as the surface on which a crystal is formed.

The ion species to be implanted for formation of the nucleation surface ($S_{NDL}$) is not limited to As, but ions of the group III elements, ions of the group V elements, and further ions of the group II elements and ions of the group VI elements can be also used.

As the III-V group compound, InP monocrystal can be selectively formed on an amorphous substrate by use of trimethyl indium $In(CH_3)_3$ and phosphine $PH_3$ as the reactive gases, and AlSb monocrystal by use of trimethylaluminum $Al(CH_3)_3$ and stibine $SbH_3$. According to combinations of the reactive gases as described above, monocrystals of GaP, GaSb, InAs, InSb, AlAs, AlP can be selectively grown, and further mixed crystal III-V group compound monocrystal according to any desired combination can be selectively grown.

Also, the reactive gas of the group III element is not limited to compounds having methyl groups as described above, but compounds having ethyl groups, propyl groups, butyl groups, isobutyl groups such as triethylgallium $Ga(C_2H_5)_3$, tripropyl indium $In(C_3H_7)_3$, tributyl gallium $Ga(C_4H_9)_3$, triisobutylaluminum $Al(CH_3)_2CHCH_2$, etc. can be also used.

The mixed crystal compound semiconductor can be selectively grown on the $Al_2O_3$ provided on $SiO_2$ similarly as in Example 2 as the nucleation surface ($S_{NDL}$), as a matter of course.

Further, in the respective Examples as described above, there are shown examples in which the MOCVD method is used in the step of selective growth of GaAs and GaAlAs monocrystals, but selective growth of the III-V group compound monocrystal can be performed also according to the same principle by use of the MBE (molecular beam epitaxy) method, etc.

As described in detail above, the III-V group compound crystal article and the process for forming the same according to the present invention, by forming a nucleation surface ($S_{NDL}$) of a material having sufficiently larger nucleation density (ND) than the material for formation of non-nucleation surface ($S_{NDS}$) sufficiently finely so as to grow only a single nucleaus, a monocrystal is grown selectively at the site where the fine nucleation surface ($S_{NDL}$) exists, whereby a crystal such as a monocrystal with necessary size, monocrystals shaped in a plurality of islands, a polycrystal with controlled grain size and grains size distribution, etc. can be easily formed on a base substrate of any desired material. Besides, no special new preparation device is required, but it can be formed by use of a device used in conventional semiconductor process.

Also, the crystal according to the present invention is not restricted with respect to the material of the base substrate as in the prior art, and therefore can accomplish easily three-dimensional integration, area enlargement and low cost. For example, since a monocrystal or polycrystal of III-V group compounds can be easily formed on an amorphous insulating material, a multilayer formation of an element with excellent electrical characteristics can be accomplished to realize an integrated circuit of multi-functions not found in the prior art. Specifically, it becomes possible to obtain optical element, surface acoustic element, piezoelectric element, etc., and integration of each of them with surrounding circuit IC, etc. Also, the present invention, when an inexpensive glass or ceramic is used as the base material, can be applied for a large area electronic device such as a large scale flat panel display having the driving circuit integrated on one sheet of glass, etc.

Further, the present invention can form monocrystals with necessary sizes at a plural number of sites by forming the above nucleation surfaces ($S_{NDL}$) with desired sizes and desired intervals therebetween on the non-nucleation surface ($S_{NDS}$), whereby the formation steps can be simplified to a great extent and also the formation time shortened, as compared with the melting solidification method in which monocrystal is formed by irradiation of laser or electron beam.

Also, by controlling the interval between the nucleation surfaces ($S_{NDL}$) to be formed on the above non-nucleation surface ($S_{NDS}$), a polycrystal controlled in its grain size through the interval can be formed. The process for forming the polycrystal is better in controllability of grain size and grain size distribution as compared with the process of the prior art in which a polycrystal of a large grain size is formed according to the above melting solidification process, and also the formation time can be shortened to a great extent.

What is claimed is:

1. A Group III-V compound crystal article comprising a substrate having a non-nucleation surface with a smaller nucleation density ($S_{NDS}$) and a nucleation surface with a larger nucleation density ($S_{NDL}$), the nucleation density of the nucleation surface being greater than the nucleation density of the non-nucleation surface, said non-nucleation surface and said nucleation surface being arranged adjacent to each other and said nucleation surface being an amorphous material and having a sufficiently small area so as to form only a single nucleus from which a Group III-V compound monocrystal is grown and spread on said non-nucleation surface ($S_{NDS}$) beyond said nucleation surface ($S_{NDL}$).

2. A III-V group compound crystal article according to claim 1, wherein said nucleation surface ($S_{NDL}$) is arranged in a plural number.

3. A III-V group compound crystal article according to claim 1, wherein said nucleation surface ($S_{NDL}$) is arranged in a plural number as sectionalized.

4. A III-V group compound crystal article according to claim 1, wherein said nucleation surface ($S_{NDL}$) is arranged in a plural number as sectionalized regularly within the non-nucleation surface ($S_{NDS}$).

5. A III-V group compound crystal article according to claim 1, wherein said nucleation surface ($S_{NDL}$) is arranged in a plural number as sectionalized irregularly within the non-nucleation surface ($S_{NDS}$).

6. A III-V group compound crystal article according to claim 2, wherein the monocrystals grown respectively from said nucleation surfaces ($S_{NDL}$) are adjacent to the monocrystals grown from the adjoining nucleation surfaces ($S_{NDL}$).

7. A III-V group compound crystal article according to claim 2, wherein the monocrystals grown respectively from said nucleation surfaces ($S_{NDL}$) are spatially apart from the monocrystals grown from the adjoining nucleation surfaces ($S_{NDL}$).

8. A III-V group compound crystal article according to claim 1, wherein said nucleation surface ($S_{NDL}$) is formed on the bottom surface of a concavity with a desired shape provided on said non-nucleation surface ($S_{NDS}$), and said single crystal is formed in shape of an island embedding said concavity therein.

9. A III-V group compound crystal article according to claim 1, wherein said amorphous material is $SiO_2$.

10. A III-V group compound crystal article according to claim 1, wherein said III-V group compound semiconductor is a binary system III-V group compound semiconductor.

11. A III-V group compound crystal article according to claim 1, wherein said III-V group compound semiconductor is a mixed crystal III-V group compound semiconductor.

12. A ternary Group III-V compound mixed crystal article comprising a substrate having a non-nucleation surface with a smaller nucleation density ($S_{NDS}$) and a nucleation surface with a larger nucleation density ($S_{NDL}$), the nucleation density of the nucleation surface being greater than the nucleation density of the non-nucleation surface, said non-nucleation surface and said nucleation surface being arranged adjacent to each other and said nucleation surface being an amorphous material and having a sufficiently small area so as to form only a single nucleus from which a ternary Group III-V compound mixed monocrystal is grown and spread on said non-nucleation surface ($S_{NDS}$) beyond said nucleation surface ($S_{NDL}$).

13. The crystal article according to claim 12, wherein said ternary Group III-V compound is GaAlAs.

* * * * *